(12) United States Patent
Jung et al.

(10) Patent No.: US 6,585,525 B2
(45) Date of Patent: Jul. 1, 2003

(54) MEMORY MODULES HAVING CONDUCTORS AT EDGES THEREOF AND CONFIGURED TO CONDUCT SIGNALS TO OR FROM THE MEMORY MODULES VIA THE RESPECTIVE EDGES

(75) Inventors: Tae-sung Jung, Seoul (KR); Won-ki Song, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/845,550

(22) Filed: Apr. 30, 2001

(65) Prior Publication Data

US 2002/0022405 A1 Feb. 21, 2002

(30) Foreign Application Priority Data

Apr. 29, 2000 (KR) .......................................... 2000-23105
Aug. 16, 2000 (KR) .......................................... 2000-47147

(51) Int. Cl.[7] ............................................... H01R 12/00
(52) U.S. Cl. ..................... 439/55; 439/60; 439/924.1; 439/59; 439/65; 361/760
(58) Field of Search ..................... 439/55, 59, 61, 439/65, 60, 924.1; 361/760

(56) References Cited

U.S. PATENT DOCUMENTS

| | | | | |
|---|---|---|---|---|
| 4,685,031 A | * | 8/1987 | Fife et al. ................... | 439/631 |
| 5,189,598 A | * | 2/1993 | Bolan et al. ................... | 439/60 |
| 5,270,964 A | * | 12/1993 | Bechtolsheim et al. .. | 439/924.1 |
| 6,205,031 B1 | * | 3/2001 | Herzog et al. ................. | 439/65 |
| 6,273,759 B1 | * | 8/2001 | Perino et al. ................ | 439/631 |
| 6,347,039 B1 | * | 2/2002 | Lee .............................. | 361/760 |

FOREIGN PATENT DOCUMENTS

| | | |
|---|---|---|
| JP | 55045124 | 3/1980 |
| JP | 6061289 | 2/1994 |
| JP | 11088380 | 3/1999 |
| KR | P2000-0018572 | 4/2000 |

OTHER PUBLICATIONS

Notice to Submit Response, Korean Application No. 10-2000-0047147, Jun. 18, 2002.

* cited by examiner

Primary Examiner—Tho D. Ta
(74) Attorney, Agent, or Firm—Myers Bigel Sibley & Sajovec

(57) ABSTRACT

Memory modules, and related memory module sockets, can include a plurality of connector pins adjacent to a first edge of the memory module that are configured to conduct a plurality of first signals to or from the memory module via the first edge and a plurality of first conductors adjacent to a second edge of the memory module that are configured to conduct a plurality of second signals to or from the memory module via the second edge.

16 Claims, 4 Drawing Sheets

FRONT SIDE

BACK SIDE

MEMORY MODULES HAVING CONDUCTORS AT EDGES THEREOF AND CONFIGURED TO CONDUCT SIGNALS TO OR FROM THE MEMORY MODULES VIA THE RESPECTIVE EDGES

RELATED APPLICATIONS

This application claims priority from Korean Application No. 00-23105, filed Apr. 29, 2000 and Korean Application No. 00-47147, filed Aug. 16, 2000.

FIELD OF THE INVENTION

The present invention relates to memory modules in general, and more particularly, to the expansion of memory modules.

BACKGROUND OF THE INVENTION

It is known to provide communications between devices on a system board via a system bus including, for example, a control bus, an address bus, and a data bus. The busses may be shared by devices on the system board such as a microcontroller, a memory module, and an input/output device. The memory module may be controlled by a memory controller to use an internal serial bus to provide high speed operation.

FIG. 1 illustrates a system board 10 having a conventional serial bus 9 thereon. The system board 10 can include a plurality of memory modules 12, 14 and 16, in respective sockets 13, 15, and 17. The memory modules 12, 14 and 16 can be connected to a memory controller 11 via the serial bus 9. Signals from the memory controller 11 may be provided to the memory module 12 via connector pins on the memory module 12 when the memory module 12 is inserted into the socket 13. The signals provided to the memory module 12 can be used to address memory devices on the memory module 12. The signals can also be conducted across the memory module 12 to other connector pins thereon so that the signals can also be provided to the memory modules 14 and 16 via the serial bus 9. For example, a signal can be conducted from the memory controller 11 onto the memory module 12, across the memory module 12, off the memory module 12 to the memory module 14, across the memory module 14, off the memory module 14 to the memory module 16, across the memory module 16, and off the memory module 16 to the termination resistor Rterm which terminates the serial bus 9.

It is known to increase bandwidth by increasing the number of signal lines provided to the memory modules. Accordingly, as the number of signal lines increases, so may the number of connector pins on the memory modules. Therefore, the memory module may also increase in size to accommodate the increased number of signals. As the size of the memory module increases, the sockets may also become larger which may increase the size of the system board 10. Increasing the size of the sockets and the system board 10 may also increase the length of the transmission lines used to carry the signals from one socket to another. To compensate for this, buffers or repeaters (not shown) may be added to the signal lines to reduce the deterioration of the signals. Adding such devices may increase the cost of the system.

SUMMARY OF THE INVENTION

Embodiments according to the present invention can provide memory modules having a plurality of connector pins adjacent to a first edge of the memory module that are configured to conduct a plurality of first signals to or from the memory module via the first edge and a plurality of first conductors adjacent to a second edge of the memory module that are configured to conduct a plurality of second signals to another memory module that is substantially coplanar with the memory module via the second edge.

In some embodiments according to the present invention, the first and second edges are oriented in different directions. In other embodiments, the memory modules can further include a plurality of second conductors that are adjacent to a third edge of the memory module which is opposite the second edge and are electrically connected to selected ones the plurality of connector pins.

In other embodiments, the plurality of second conductors are electrically connected to the plurality of first conductors. In other embodiments according to the present invention, the plurality of connector pins are arranged in a row. In still other embodiments according to the present invention, the plurality of first conductors are arranged in columns wherein adjacent ones of the columns are offset relative to one another in the column direction.

In some embodiments according to the present invention, the plurality of first conductors and the plurality of second conductors are on a first side of the memory module and the memory module further includes a plurality of conductive lines that are on a second side of the memory module, opposite the first side, which electrically connect the plurality of first conductors and the plurality of third conductors.

Pursuant to further embodiments according to the present invention, a memory module socket can be configured to be mounted on a system board and configured for insertion of first and second memory modules therein. The memory module socket can include a connector pin interface that is configured to electrically connect a plurality of first conductive lines on the system board to a plurality of first conductors located at a first edge of the first memory module when the first memory module is inserted in the memory module socket and a first conductor interface that is configured to electrically connect to a plurality of second conductors on the first memory module to the second memory module when the first memory module is inserted in the memory module socket.

In some embodiments according to the present invention, the first conductor interface and the connector pin interface are oriented in different directions. In other embodiments, the memory module socket includes an intermediate portion of the memory module socket that defines first and second slots of the memory module socket. The first conductor interface is configured to electrically conduct signals from a first memory module in the first slot to a second memory module in the second slot via the intermediate portion without using the connector interface.

Pursuant to further embodiments, memory modules according to the present invention can include a circuit board, a plurality of memory devices on the circuit board, a plurality of pins that are electrically connected to the plurality of memory devices in a predetermined region of the circuit board, and a plurality of connector pins that are electrically connected to the plurality of memory devices on both sides of the region in which the memory chips are located on the circuit board.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
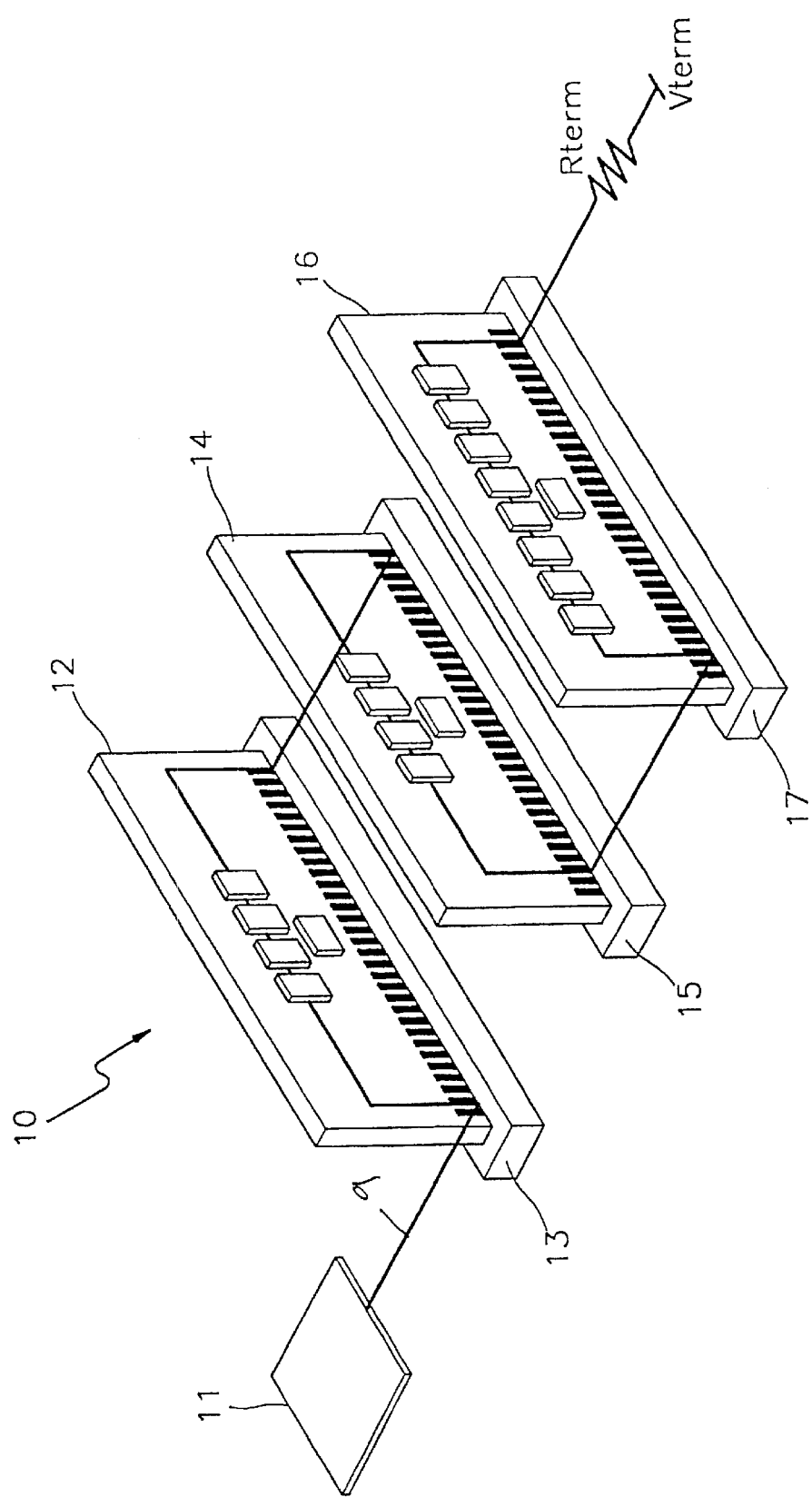
FIG. 1 is a perspective drawing that illustrates the routing of signals between sockets on a system board according to the prior art.
Figure 2A:
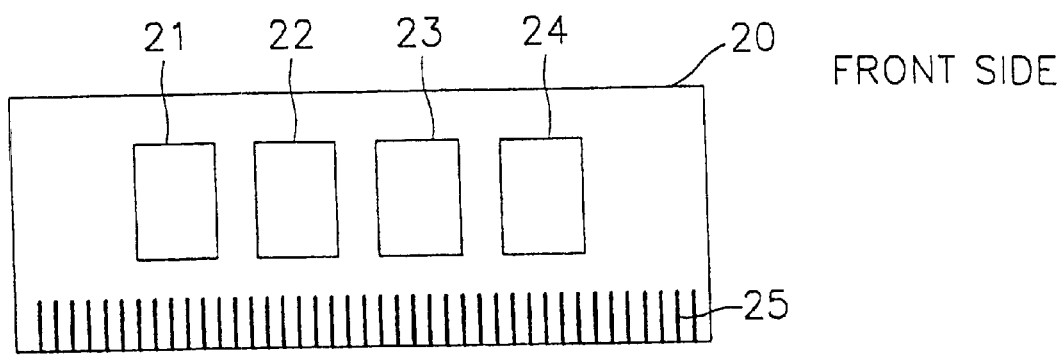
FIGS. 2A–2B are block diagrams illustrating embodiments according to the present invention.

FIG. 2A is a block diagram that illustrates a first side of a memory module 20 on which a plurality of memory devices 21, 22, 23 and 24 are located in a predetermined region thereof. The memory module 20 can also include memory module connector pins 25 located adjacent to a first edge of the memory module 20. It will be understood that although the present invention is described herein by reference to memory devices, the present invention may be utilized with other types of devices such as logic devices.

Figure 2B:
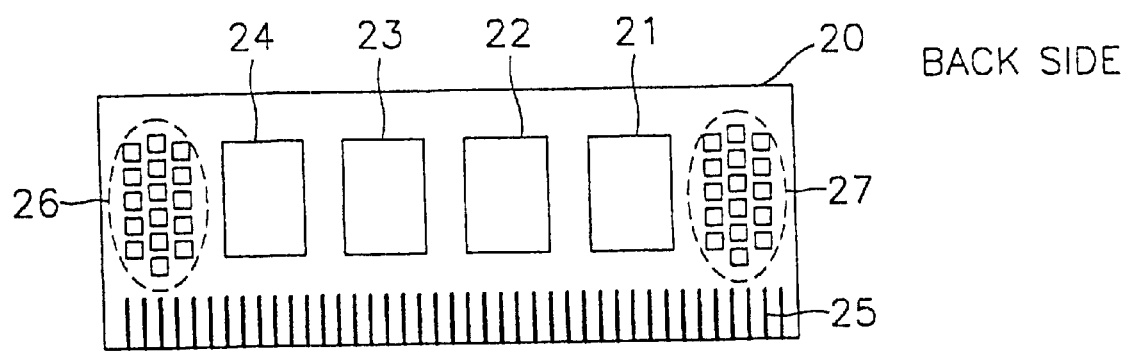

FIG. 2B is a block diagram that illustrates a second side of the memory module 20 which is opposite the first side. The second side of the memory module 20 can include a plurality of first conductors 26 adjacent a second edge of the memory module 20 and adjacent to the memory device 24 and a plurality of second conductors 27 adjacent a third edge of the memory module 20 and adjacent to the memory device 21. Each of the pluralities of the first and second conductors 26, 27 can be located between the memory devices and the respective edge to which the plurality of conductors is adjacent. As shown in FIG. 2B, the first and third edges can be oriented in a different direction than the first edge, which may, for example, be substantially perpendicular to the first edge.

Signals may be input to and output from the memory module 20 via the connector pins 25 and via the conductors 26 and 27. Accordingly, when additional signals are provided to increase bandwidth, the additional signal lines may be connected the memory module via the conductors 26 and 27. Therefore, in contrast to conventional memory modules, fewer connector pins 25 may need to be added to accommodate additional signal lines.

Figure 3:
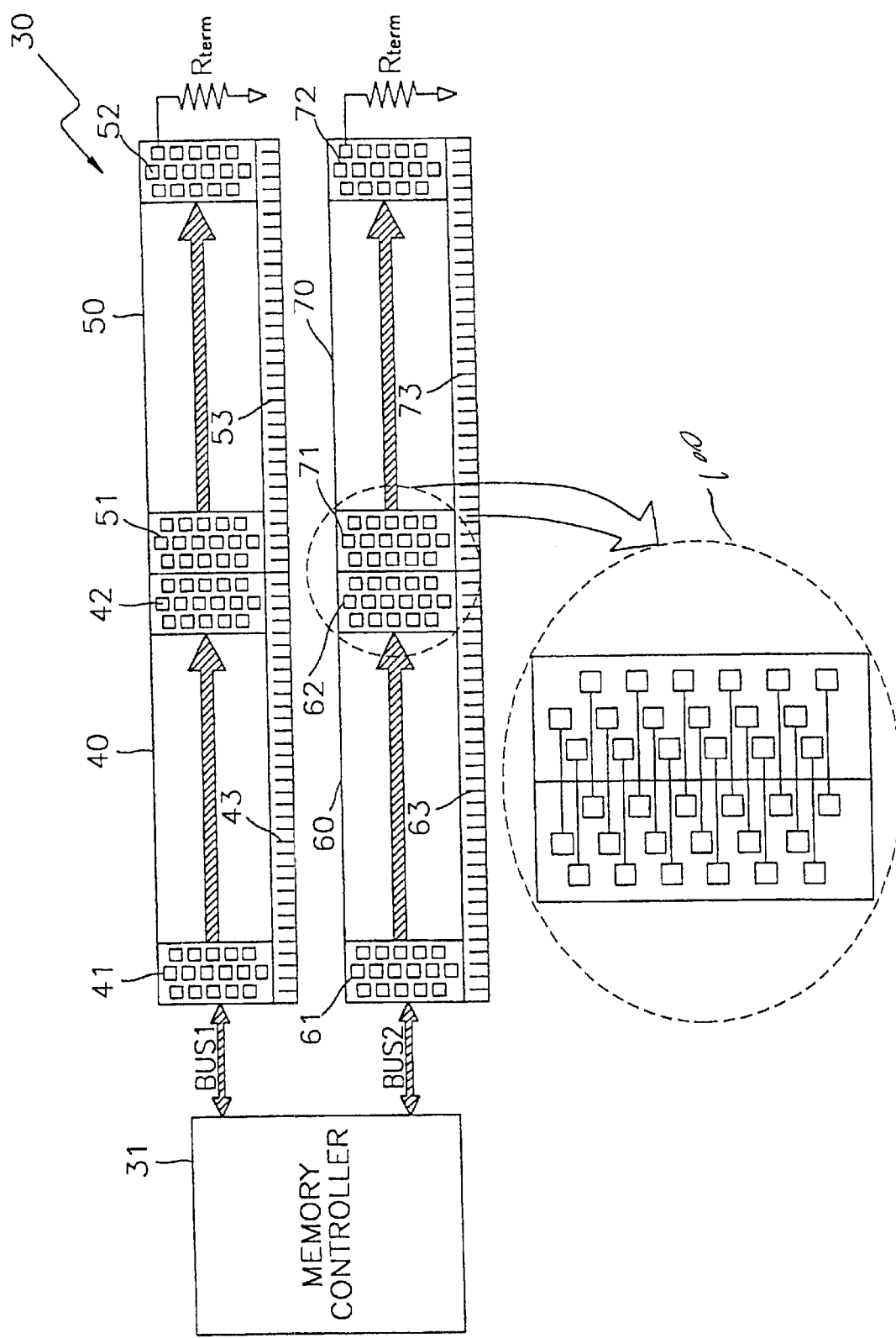
FIG. 3. is a block diagram of a system board that illustrates embodiments of memory modules according to the present invention.

FIG. 3 is a block diagram of a system board 30 including memory modules 40, 50, 60, and 70 according to the present invention. The memory modules 40, 50, 60 and 70 can be connected to a memory controller 31 via BUS1 and BUS2. Pairs of the memory modules can be connected in series by connecting conductors on the memory modules included in the pair. The memory modules can be substantially coplanar to electrical connections in the same direction therebetween. The memory modules can also be aligned coaxially as shown in FIG. 3. For example, as shown in FIG. 3, the memory modules 60 and 70 can be connected in series by electrically connecting the conductors 62 and 71 so that signals provided to the memory module 60 by BUS2 can be electrically connected to the memory module 70 as shown, for example, in the highlighted region 100. The memory modules 40 and 50 can also be connected in series by connections between the conductors 42 and 51.

In some embodiments, the conductors on memory modules connected in serial can be electrically connected by an intermediate section of a memory module socket that interfaces to both of the memory modules in the pair along the edges of the memory modules adjacent to where the conductors are located on the memory modules. Electrical contact can be maintained between the memory modules, for example, by mechanical contact provided by the socket into which the modules are inserted. Alternatively, the electrical connections can be provided by locating the conductors on the faces of opposing edges of the respective memory modules. In other embodiments, the conductors can be electrically connected, for example, by soldering the conductors together.

It will be understood that conductive lines may be used to connect the pluralities of conductors on each of the memory modules. For example, the conductors 41 can be connected to the conductors 42 via conductive lines located on the first or second side of or inside the memory module 40. As shown in FIG. 3, the respective signal lines can be terminated by resistors Rterm electrically connected to conductors 52 and 72. It will be understood that the memory modules 50 and 70 can be dummy memory modules which include no memory devices and provide termination for the signal lines conducted by the memory modules 40 and 60.

As shown in area 100 the conductors located on adjacent memory modules may be arranged in a complementary staggered pattern so that, for example, conductive lines used to connect the adjacent conductors may be straight and may be shortened and may be substantially the same distance between each pair by corresponding adjacent conductors. The complementary staggered pattern may reduce the loading of BUS1 and BUS2, and may allow an increase in transmission speed. In some embodiments, the conductors can be arranged in columns, as shown in the highlighted area 100, and adjacent ones of the columns can be offset relative to one another in the column direction (or a zig zag pattern). Other types of arrangements can also be used.

According to the present invention, the number of memory module pins 25 may therefore be reduced so that the size of the memory module may be maintained or reduced. Furthermore, the number of signal lines provided between separate memory modules using the connector pins 25 may also be reduced, therefore, allowing a reduction in the number of signal lines on the system board 30 which may in turn allow a reduction of the size of the system board 30 itself.

Figure 4:
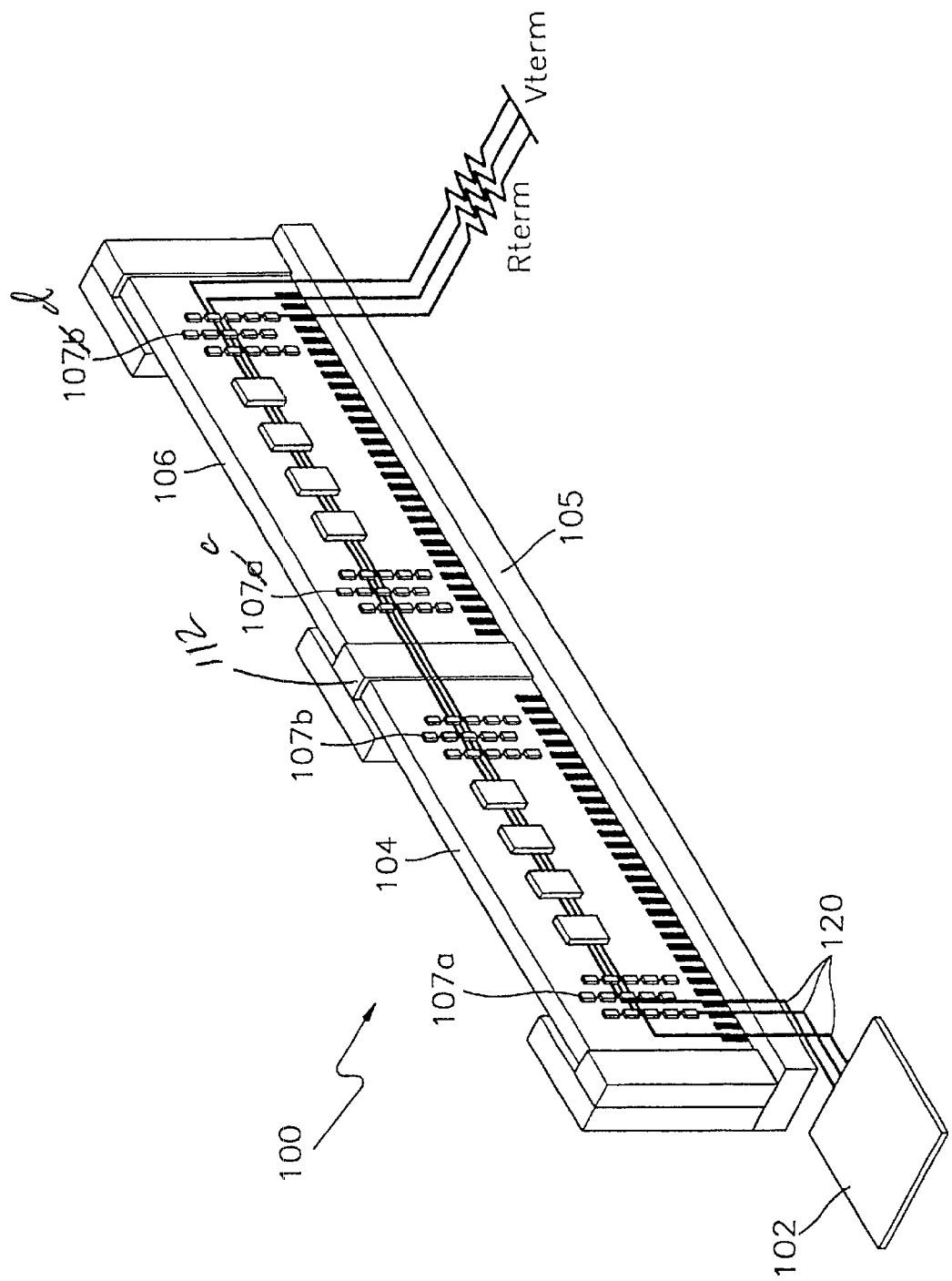
FIG. 4. is a perspective drawing that illustrates embodiments of memory modules according to the present invention.

FIG. 4 is a perspective drawing that illustrates embodiments according to the present invention. Two memory modules 104, 106 can be connected in series by conductive lines on an intermediate portion 112 of a memory module socket 105. The memory controller 102, the first memory module 104, and the second memory module 106 can be connected to each other through bus lines 120 on a system board 100. In some embodiments, the first memory module 104 and the second memory module 106 are inserted into a single memory module socket 105. In other embodiments, the first and second memory modules 104, 106 are inserted into a plurality of sockets connected in serial. The first memory module 104 and the second memory module 106 can be similar to the memory modules disclosed in reference to FIG. 2.

The bus lines 120 can be provided to the conductors 107a on the first memory module 104 via first connector pins located adjacent to a first edge of the first memory module 104. The conductors 107*a* can be located adjacent to a second edge of the first memory module 104. The conductors 107*a* can be connected to conductors 107*b* via conductive lines therebetween. The conductors 107*b* can be located adjacent to a third edge of the first memory module 104.

The conductors 107*b* can be connected to corresponding conductors 107*c* of the second memory module 106 located along a second edge thereof via conductive lines on the intermediate portion 112 of the memory module socket 105 that interfaces to the first and second memory modules 104, 106 at the third and second edges thereof respectively. The conductors 107*c* can be connected to the conductors 107*d* which can be terminated by a resistor Rterm connected to a termination voltage Vterm.

In some embodiments, the intermediate portion 112 of the memory module socket 105 can include a first conductor interface that is configured to electrically connect to a plurality of second conductors on the memory module 104 located adjacent to a second edge thereof when the memory module 104 is inserted in the memory module socket 105. The first conductor interface and the connector pin interface can be oriented in different directions.

In some embodiments, the connector interface and the intermediate portion 112 can define first and second slots of the memory module socket 105. The second conductor interface can electrically conduct signals from the memory module 104 in the first slot to the memory module 106 in the second slot without using the connector interface to conduct the signals between the memory modules inserted into the first and second slots.

In some embodiments, the memory module socket 105 can be configured to be mounted to the system board and configured for insertion of the first and second memory modules 104, 106 therein. The memory module socket 105 can include a connector pin interface configured to electrically connect a plurality of first conductive lines on the system board to a plurality of first conductors located at a first edge of the memory module 104 when the memory module 104 is inserted in the first slot of the memory module socket 105.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A memory module comprising:
   a plurality of connector pins adjacent to a first edge of the memory module configured to conduct a plurality of first signals to or from the memory module via the first edge; and
   a plurality of first conductors adjacent to a second edge of the memory module configured to conduct a plurality of second signals to another memory module that is substantially coplanar with the memory module via the second edge;
   wherein at least two of the plurality of first conductors are spaced apart from the second edge by different distances.

2. A memory module according to claim 1, wherein the first and second edges are oriented in different directions.

3. A memory module according to claim 1, wherein the plurality of connector pins are arranged in a row.

4. A memory module according to claim 1, wherein the plurality of first conductors are arranged in columns wherein adjacent ones of the columns are offset relative to one another in the column direction and are configured to electrically connect to third conductors arranged in a complementary pattern on the other memory module.

5. A memory module according to claim 1 further comprising:
   a plurality of second conductors adjacent to a third edge of the memory module opposite the second edge and electrically connected to selected ones the plurality of connector pins.

6. A memory module according to claim 5, wherein the plurality of second conductors are electrically connected to the plurality of first conductors.

7. A memory module according to claim 5, wherein the plurality of first conductors and the plurality of second conductors are on a first side of the memory module; and
   wherein the memory module further comprises:
   a plurality of conductive lines on a second side of the memory module, opposite the first side, configured to electrically connect the plurality of first conductors and the plurality of second conductors.

8. A memory module socket configured to be mounted on a system board and configured for insertion of first and second memory modules therein, the memory module socket comprising:
   a connector pin interface configured to electrically connect a plurality of first conductive lines on the system board to a plurality of first conductors located at a first edge of the first memory module when the first memory module is inserted in the memory module socket; and
   a first conductor interface configured to electrically connect a plurality of second conductors adjacent to a second edge of the first memory module to the second memory module that is substantially coplanar with the memory module when the first memory module is inserted in the memory module socket.

9. A memory module socket according to claim 8, wherein the first conductor interface and the connector pin interface are oriented in different directions.

10. A memory module socket according to claim 8 further comprising:
    an intermediate portion of the memory module socket that defines first and second slots of the memory module socket; and
    wherein the first conductor interface is configured to electrically conduct signals from the first memory module in the first slot to the second memory module in the second slot via the intermediate portion without using the connector interface.

11. A memory module comprising:
    a circuit board;
    a plurality of memory devices on the circuit board;
    a plurality of pins electrically connected to the plurality of memory devices in a predetermined region of the circuit board; and
    a plurality of connector pins electrically connected to the plurality of memory devices on both sides of the region in which the memory devices are located on the circuit board, wherein the connector pins are disposed in multiple columns, wherein the connector pins are disposed in a zigzag pattern.

12. The memory module of claim 11, wherein the plurality of connector pins are disposed in a meeting portion with a socket to which the memory module is inserted.

13. A memory module socket, configured to be mounted on a system board and configured for insertion of first and second memory modules therein, the memory module socket comprising:
- a connector pin interface configured to electrically connect a plurality of first conductive lines on the system board to a plurality of first conductors located at a first edge of the first memory module when the first memory module is inserted in the memory module socket; and
- a first conductor interface configured to electrically connect a plurality of second conductors adjacent to a second edge of the first memory module to the second memory module when the first memory module is inserted in the memory module socket.

14. A memory module socket according to claim 13, wherein the first conductor interface and the connector pin interface are oriented in different directions.

15. A memory module socket according to claim 13 further comprising:
- an intermediate portion of the memory module socket that defines first and second slots of the memory module socket; and
- wherein the first conductor interface is configured to electrically conduct signals from the first memory module in the first slot to the second memory module in the second slot via the intermediate portion.

16. A memory module socket according to claim 13, wherein the plurality of second conductors are on a first side of the memory module and a plurality of second conductors are on a second side of the memory module, opposite the first side.

* * * * *